United States Patent
Figov (10) Patent No.: US 6,899,998 B2
(45) Date of Patent: May 31, 2005

(54) METHOD AND A PLATE FOR DIGITALLY-IMAGED OFFSET PRINTING

(75) Inventor: Murray Figov, Ra'anana (IL)

(73) Assignee: Creo Il Ltd., Herzlia Pituach (IL)

( * ) Notice: Subject to any disclaimer, the term of this patent is extended or adjusted under 35 U.S.C. 154(b) by 101 days.

(21) Appl. No.: 10/148,913

(22) PCT Filed: Dec. 5, 2000

(86) PCT No.: PCT/IL00/00818
§ 371 (c)(1),
(2), (4) Date: Oct. 2, 2002

(87) PCT Pub. No.: WO01/42856
PCT Pub. Date: Jun. 14, 2001

(65) Prior Publication Data
US 2003/0134230 A1 Jul. 17, 2003

(30) Foreign Application Priority Data
Dec. 7, 1999 (IL) ................................. 133355

(51) Int. Cl.[7] ........................... G03F 7/004; G03F 7/16; G03F 7/09; G03F 7/11
(52) U.S. Cl. ..................................... 430/302
(58) Field of Search ........................ 430/302

(56) References Cited

U.S. PATENT DOCUMENTS

| | | | | |
|---|---|---|---|---|
| 3,537,853 A | * | 11/1970 | Wessells et al. | 430/306 |
| 3,615,450 A | * | 10/1971 | Werber et al. | 430/306 |
| 3,654,864 A | | 4/1972 | Ovshinski | |
| 3,741,118 A | | 6/1973 | Carley | |
| 3,773,514 A | * | 11/1973 | Fromson | 430/302 |
| 3,836,709 A | * | 9/1974 | Hutchison | 430/306 |
| 4,286,043 A | | 8/1981 | Taylor, Jr. | |
| 4,486,529 A | | 12/1984 | Jeffers et al. | |
| 4,718,340 A | | 1/1988 | Love, III | |
| 4,806,450 A | * | 2/1989 | Hofmann et al. | 430/287.1 |
| 5,278,027 A | * | 1/1994 | Clarke | 430/307 |
| 5,339,737 A | | 8/1994 | Lewis et al. | |
| 5,353,705 A | | 10/1994 | Lewis et al. | |
| 5,487,338 A | | 1/1996 | Lewis et al. | |

FOREIGN PATENT DOCUMENTS

| | | |
|---|---|---|
| CH | 506 099 A | 4/2003 |
| EP | 0 186 844 A | 7/1986 |
| EP | 0 211 391 A | 2/1987 |
| EP | 0 248 424 A | 12/1987 |
| EP | 0345636 A | 12/1989 |
| JP | 6297565 A | 10/1994 |
| WO | WO 98 53370 A | 11/1998 |
| WO | WO-98/53370 A1 * | 11/1998 |
| WO | WO 99 06890 A | 2/1999 |

OTHER PUBLICATIONS

Grant et al, "Grant and Hackh's Chemical Dictionary; American, International, European and British Usage", Fifth ed, MicGraw-Hill Book Company, New York, NY 1987 pp. 115, 377, 409.*

Bob Thompson, "Materials: Science and Technology", published by Pira (Leathershead, Sussex, UK), 1998, Chapters 20 & 21.

* cited by examiner

*Primary Examiner*—Cynthia Hamilton
(74) *Attorney, Agent, or Firm*—Edward Langer, Pat. Atty.; Shiboleth, Yisraeli, Roberts, Zisman & Co.

(57) ABSTRACT

An offset plate sensitive to UV or visible light, prepared simply and imaged digitally therewith in a CTP method, and also processed in a simple manner. The plate is provided as a photopolymer plate with increased sensitivity, and is used in a simple imaging-on-press system, using the surface of a lithographic printing cylinder itself as a plate substrate. The method of preparing the printing plate begins by applying a photosensitive liquid coating to the substrate, digitally imaging the coated substrate, using an actinic light source to polymerize portions of the liquid coating in accordance with the imaging, and washing the liquid.

19 Claims, 6 Drawing Sheets

FIG.1(PriorArt)

FIG.2 (PriorArt)

METHOD AND A PLATE FOR DIGITALLY-IMAGED OFFSET PRINTING

FIELD OF THE INVENTION

The present invention generally relates to computer-to-plate (CTP) offset lithographic printing, and more particularly, to a novel method for producing an inexpensive and simple, offset printing plate which is digitally-imaged using actinic light.

BACKGROUND OF THE INVENTION

Offset lithographic printing has remained a most popular method of printing for many years. An important reason for this is the relative ease with which offset lithographic printing plates can be produced. Currently, the most widely-used method for plate preparation has remained that which utilizes specially-prepared masking films through which pre-sensitized printing blanks are selectively hardened or softened (according to the chemistry of the plate) by exposure to ultra-violet light. The plate then undergoes a development process, during which the more soluble regions of the plate (which may be the exposed or the unexposed areas) are washed away. A detailed description of the system and the plates used can be found in Chapter 20 of the book Printing *Materials: Science and Technology* by Bob Thompson, published by Pira (Leathershead, Sussex, UK), 1998.

In recent years, various considerations have arisen that point to advantages for modification of hitherto generally-accepted practices. With the advent of computers, information for printing is prepared digitally and it has become preferable to use this digital information as directly as possible in plate preparation. One obvious way would be to eliminate the masking film. Not only are these films a source of expense, but the most widely-used films are based on silver chemistry whereby the exposure and handling of the film must be in a light-excluding environment. In addition, the exposed film must be processed with chemical solutions which are unstable, messy and environmentally problematic.

One answer is to be found in computer-to-plate (CTP) systems whereby the offset lithographic plates are directly imaged with a light source which is modulated to correspond to the digital information from the computer. Thus the film intermediate is completely eliminated. It would have been easy and convenient if the UV sensitive pre-sensitized plates previously used for imaging with an intermediate film could have been used for direct digital imaging. However, it has been found necessary to either sensitize plates for imaging with visible light or to develop plates that are sensitive to radiation in the near infrared. The reason for this is that UV lasers are very expensive and difficult to modulate. Visible and infrared lasers are more readily available and less costly and easier to modulate to produce the digital signal necessary for imaging.

U.S. Pat. No. 4,486,529 describes the sensitizing of a negative working diazo system to the 450 nm to 530 nm region for imaging with, for example, argon-ion lasers with most of its energy being emitted in the 488 nm to 514.5 nm region. Such systems require a cover layer of, for example, polyvinyl alcohol to protect against oxygen inhibition and may also require a post-image heating stage. Sensitivity of diazo systems which are used in the coatings of pre-sensitized plates is generally in the region of 150 to 600 mJ/cm². This type of plate, like most pre-sensitized plates, needs processing with a strong alkali, although attempts are being made to develop CTP systems that are processless. The subject of CTP systems can be found in Chapter 21 of the book (Thompson, 1998) cited above.

U.S. Pat. No. 5,339,737 Lewis et al describes the processless preparation of offset lithographic printing plates, wherein the upper layer or layers of the plate are ablated away. The upper layer is either oleophobic for waterless plates or hydrophilic for conventional wet-process plates. The substrate is oleophilic in both cases. U.S. Pat. No. 5,353,705 Lewis et al is similar to the previous patent, but describes additional layers for secondary partial ablation. U.S. Pat. No. 5,487,338 is similar, but includes reflective layers.

All of these inventions involve multi-layered plates which are expensive to produce. Also, for such multi-coated systems, it is more difficult to maintain a consistent standard of quality from plate to plate. So called processless plates that are imaged by laser ablation either involve a scrubbing stage to remove ablated debris from the surface, or they need extraction systems to remove debris 'on the fly' as it is being produced during imaging.

Recently, it has been found that there are ways of imaging UV-sensitive plates by digital means, permitting the development of machines for use in CTP systems. Examples of this are the UV-Setter® 710 and ProSetter®, CTPs produced by basysPrint GmbH of Boizenburg, Germany. These are flatbed image setters based on a Spatial Light Modulator device working in transmission and a non-coherent UV light source. U.S. patent application Ser. No. 09/312,763 assigned to Scitex Corporation, describes the invention of a digital image-setter utilizing a high-resolution micro-display which can be used inter alia to image pre-sensitized offset lithographic plates which are sensitive to either UV or visible light.

With the development of these technologies, there is a need for inexpensive plates highly-sensitive to either UV or visible light. It would also be beneficial to be able to process the plate without recourse to highly-alkaline solutions that, in many countries, is prohibited by law from being disposed of in sewage systems due to environmental hazards.

A reason for simplicity of processing can be found in the development of imaging-on-press. Although the concept of imaging-on-press has been described in, for example, U.S. Pat. No. 3,654,864 (Ovshinski), U.S. Pat. No. 3,741,118 (Carley), and U.S. Pat. No. 4,718,340 (Love III), printing presses incorporating this principle, such as the GTODI by Heidleberg, have only appeared within the past few years. Such presses utilize waterless plates imaged by infrared ablation where post-imaging processing is by a cleaning method to remove ablated material, rather than by image development. As the processing has to be on press, it has to be relatively simple.

Further developments in plate design have followed the path of elimination of a plate substrate and, in its stead, the press cylinder which traditionally holds the plate becomes a reusable lithographic 'master' surface. U.S. Pat. No. 4,718,340 (Love III) describes such a process which, in one embodiment, spreads an oleophilic material onto a hydrophilic surface and then removes oleophilic material from the non-image areas. As is stated in the Abstract of this prior-art patent, no photo-induced chemical reaction or latent imaging development steps are required at any time.

All present pre-sensitized UV sensitive offset printing plates have a common constraint. The manufactured plates are coated in continuous rolls in a factory where the plates are then cut to size, boxed and sent to the customer. The plate is removed from the box by the customer and placed on a machine for imaging. In the case of UV sensitive plates, it has been the general rule that they are placed in emulsion-to-emulsion contact with an imaged masking film, imaged by flood UV and then the film is peeled off before processing the plate in a bath of aqueous alkali. It is an obvious constraint of the plate that the surface must be resistant to damage. The plate must also be dry to the touch. Although this latter constraint has been removed if non-contact imaging as used in CTP is involved, it is a constraint that hitherto has not been appreciated as restrictive in certain areas of performance. In order to achieve dry coatings, the coating formulation is either confined to substances that produce such a dry layer or have added polymers that must be present in quantities that produce the dry layer. The presence of such polymers, and limitations of the kind of photosensitive materials used to produce the dry layers, reduces opportunities to optimize coating sensitivity and simplicity of processing.

SUMMARY OF THE INVENTION

Accordingly, it is a principal object of the present invention to overcome the disadvantages associated with prior art digitally-imaged offset plates by providing an inexpensive and simple offset plate sensitive to UV or visible light that can then be imaged digitally therewith and also processed in a simple manner.

It is another object of this invention to provide photopolymer plates with increased sensitivity over previous photopolymer printing plates.

It is still a further object of this invention to provide a CTP method that can utilize an inexpensive UV or visible light source.

It is still another object of this invention to provide a simple imaging-on-press system that can utilize inexpensive plates as well as an inexpensive imaging system in the UV or visible region.

Yet a further object of this invention is to provide a plateless process for offset lithographic printing using an inexpensive imaging system and using the surface of a lithographic printing cylinder itself as a plate substrate.

In accordance with a preferred method of the present invention there is provided a simple and inexpensive method of preparing an offset printing plate usable in a lithographic printing system, said method comprising the steps of:

a) providing a printing plate and a quantity of photosensitive liquid coating;

b) applying said liquid coating to the substrate of said printing plate;

c) digitally imaging said coated substrate, in a non-contain fashion, using an actinic light source to polymerize portions of said liquid coating in accordance with said imaging; and d) washing said liquid coating with an aqueous solution after said imaging to remove unpolymerized portions of said liquid coating.

The present invention seeks to remove such constraints on coatings for offset lithographic plates as are found in the prior art, and utilizes sticky or wet layers as coatings so that little or no binder is present to interfere with the sensitivity or ease of processing. As the image processes used with this invention are non-contact and do not require contact of a film mask, having a sticky or liquid surface is not a problem.

Also, in the preferred embodiments described, since the coating process is done at the customer's location, and not provided to the customer as a finished and packed plate, handling a sticky or liquid surface is not a problem. Where the plate is provided with a sticky surface, such surface may be protected from sticking by use of a release layer bonded to a cover film, rather like that provided to sticky labels. It has been found that such coatings do not need processing by strong alkalis, but can be processed more simply as will be described in the various embodiments of the invention.

Other features and advantages of the present invention will become clear from the further detailed description and examples.

BRIEF DESCRIPTION OF THE DRAWINGS

For a better understanding of the invention with regard to the embodiments thereof, reference is made to the accompanying drawings, (shown not to scale), in which like numerals designate corresponding elements or sections throughout, and in which.

DETAILED DESCRIPTION OF THE PREFERRED EMBODIMENTS

Figure 1:
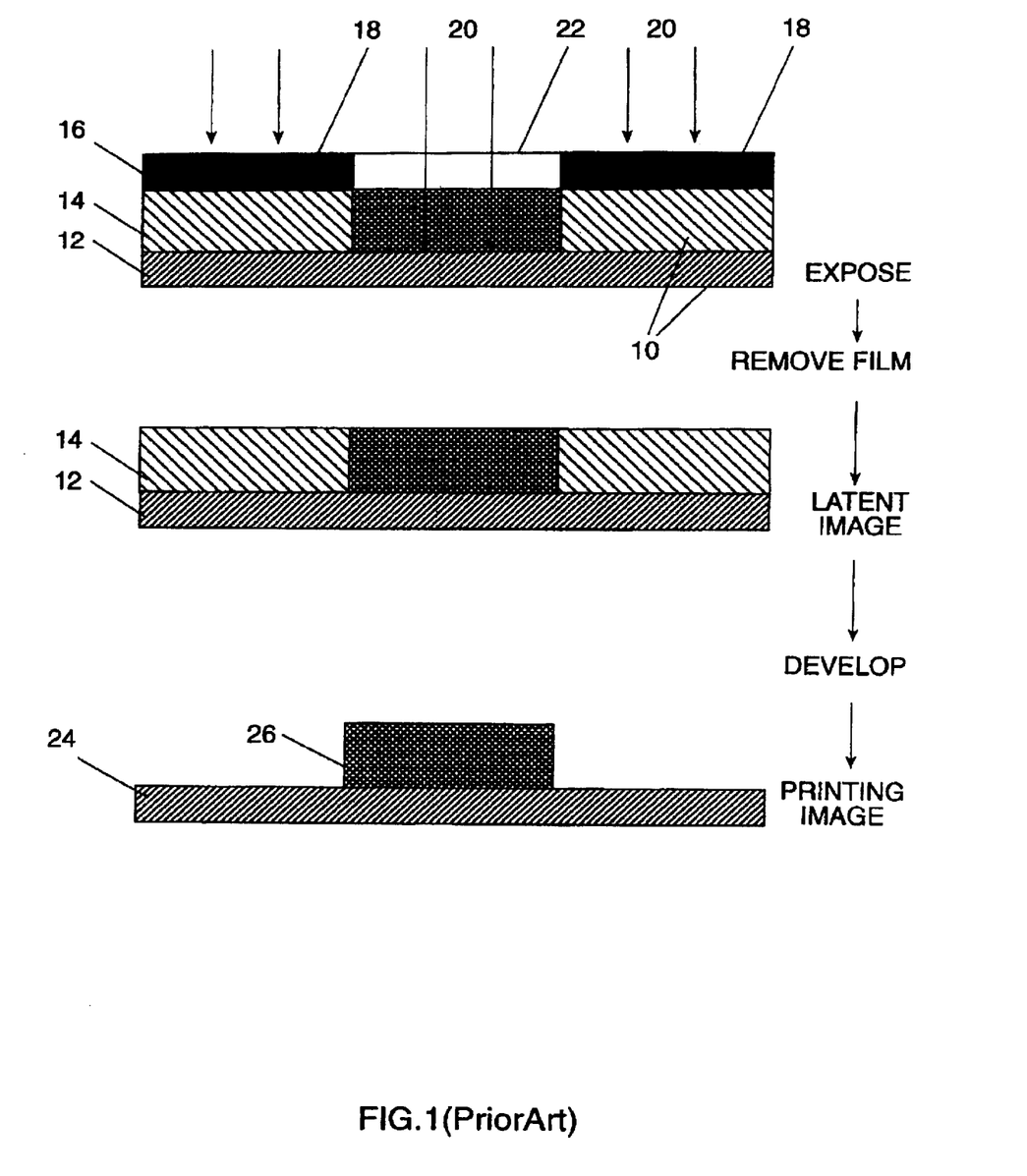
FIG. 1 shows three consecutive, enlarged, sectional views from the prior art of a conventional negative printing plate as it undergoes changes while being processed.

Referring now to the drawings, FIG. 1 shows, in a series of enlarged sectional views, an example of the widely-used prior art process of platemaking with pre-sensitized plates. Printing plate 10 comprises a grained, anodized aluminum substrate 12 and an emulsion coating 14, containing a prepolymer, photoinitiator, binder, resin, and dyes or pigments. A film negative 16 acts as a negative mask in emulsion-to-emulsion contact with plate 10 and is flood-exposed with UV light 20. The path of UV light 20 to the photosensitive, prepolymeric emulsion coating 14 is blocked by deposits of blackened, light-opaque silver 18. Thus, UV light 20 reaches emulsion coating 14 only in transparent area 22 of the negative image. Exposure of emulsion coating 14 under transparent area 22 activates the photoinitiator component of emulsion coating 14 and initiates polymerization. Negative masking film 16 is then removed from plate 10 which is then passed through a plate processor (not shown) usually providing a strong aqueous alkali for washing away the unexposed portions of emulsion coating 14.

The binder resin contained in emulsion coating 14 is usually a phenol-formaldehyde type known as Novalak. The resin is not photosensitive and its very presence acts as a diluent for the photosensitive material and consequently reduces the sensitivity of emulsion coating 14 to UV radiation 20. Emulsion coating 14 is an alkali-soluble resin except that in the polymerized areas, such as under transparent area 22, emulsion coating 14 is no longer alkali-soluble and remains hardened in place after development. Under image areas corresponding to light-opaque areas 18, however, the alkali dissolves out the unexposed, unpolymerized areas of emulsion coating 14, leaving exposed surface 24 which is hydrophilic.

Image area 26 of emulsion coating 14 which remains is an oleophilic and hydrophobic surface. In the course of the offset lithographic process, plate 10 is first damped with fountain solution which remains only on exposed, hydrophilic surface 24 and is then inked up, the ink remaining solely on image area 26 since it is oleophilic. Multiple impressions are made by the offset lithographic printing process by successively transferring ink from inked image area 26 of plate 10 to an offset press blanket cylinder (not shown) and then onto the required substrate (not shown) which is usually paper.

Figure 2A:
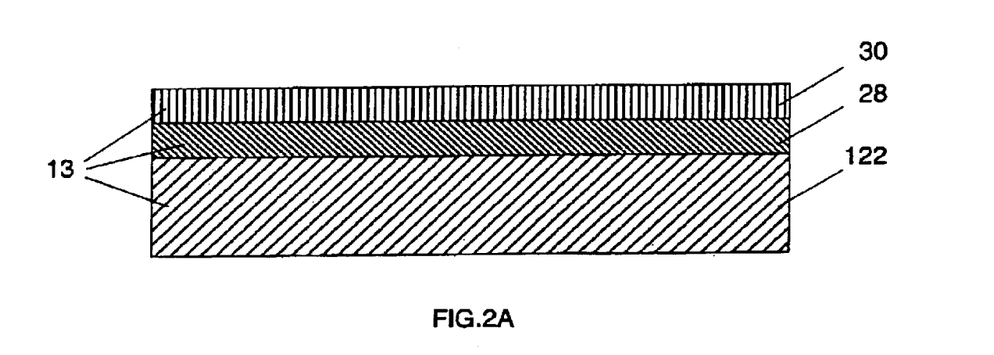
FIGS. 2A through 2C show consecutive, enlarged sectional views from the prior art of a typical, thermally-ablated plate in various stages of processing.

FIG. 2A shows, in an enlarged sectional view, a typical structure for a thermally-ablated, waterless, offset lithographic plate 13 as known in the prior art. Plate 13 comprises, in its simplest form, a substrate 122, a thermally-ablatable layer 28, and a silicone rubber top layer 30. Substrate 122 often is made up of a think, polyester sheet which is bonded to a grained, anodized aluminum base.

Figure 2B:
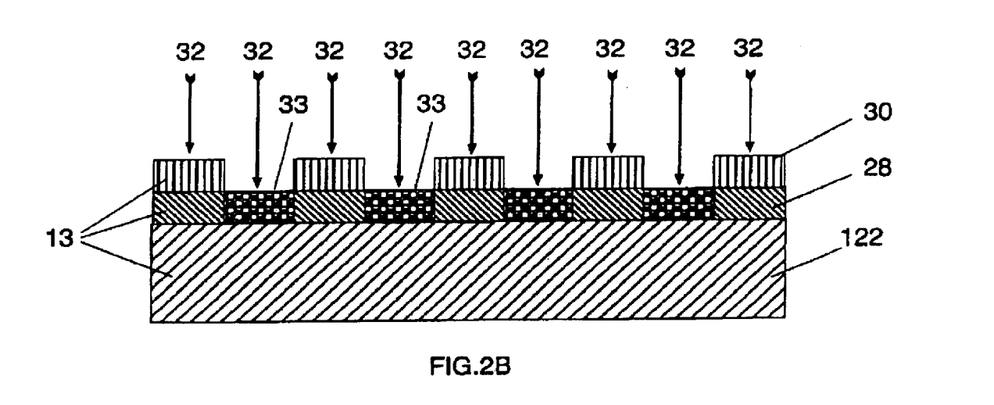

FIG. 2B shows, in an enlarged sectional view, plate 13 during exposure to infrared radiation 32. Ablative layer 28 is heated to a high temperature in localized areas 33 in accordance with a digitized image and undergoes physical and/or chemical changes in these areas ablating portions of top layer 30 which lie above said localized areas 33 in ablative layer 28 which are detached together with said localized areas 33.

Figure 2C:
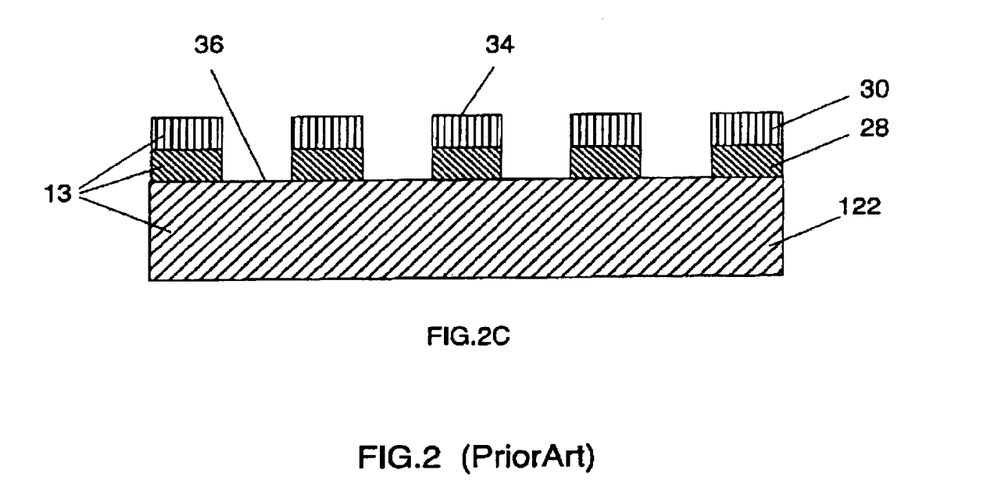

FIG. 2C, in an enlarged sectional view, shows the exposed image areas 36 on substrate 122. The remaining portions 34 of top layer 30 act as ink-repellant areas and exposed image areas 36 on substrate 122 provide the ink-receptive areas of said plate 13.

In order to ensure that exposed image areas 36 are completely free of silicone residue and ready to receive ink, it is necessary to clean plate 13 after ablation, either by dry rubbing or by washing with a liquid. In the course of the waterless, offset lithographic process, plate 13 is inked up, the ink remaining solely on the oleophilic substrate image areas 36. Multiple impressions are made by the offset lithographic printing process by successively transferring ink from the inked image areas 36 of plate 13 to an offset blanket (not shown) and then onto the required printing substrate (not shown) which is usually paper.

Referring now to FIGS. 3A through 3D, there are depicted various enlarged sectional representations of a preferred embodiment of the present invention operated in accordance with the principles of the present invention.

Figure 3A:
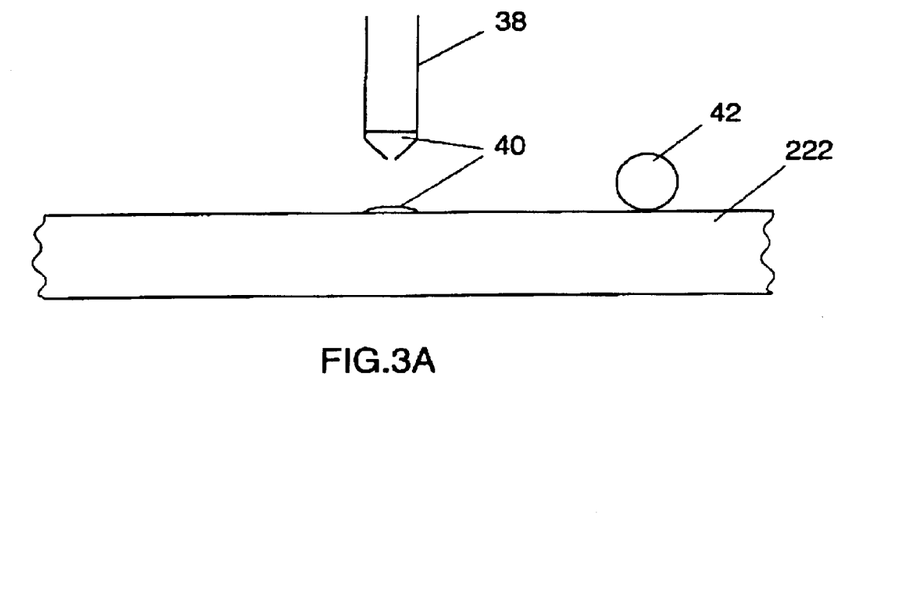
FIGS. 3A through 3D show consecutive, enlarged sectional views of an embodiment of the invention and a preferred method for the use thereof.

As shown in FIG. 3A, substrate 222 is coated in proximity to, or at the imaging stage with photosensitive material 40 which is deposited from container 38. Thus the cost of making a plate becomes relatively low as the customer purchases an uncoated plate plus a photosensitive coating solution. This can be either as CTP or for imaging-on-press, or for a plateless system.

Substrate 222 is preferably grained, anodized aluminum, but could be any hydrophilic substrate known to the art. Photosensitive material 40 is held in a liquid state in container 38 which can advantageously serve as an entire coating applicator device by moving across substrate 222, applying an exact measure of material 40 uniformly over the surface.

In yet another embodiment, material 40 is applied by applicator 42 which could be, for instance, a wire-would rod held in contact with substrate 222 so that the thickness of the coating applied to substrate 222 is controlled by the thickness of the wire used on applicator 42. The combination of devices 38 and 42 results in a method of application of a uniform liquid layer of material 40 of a controlled thickness laid down upon substrate 222.

In still another embodiment of the present invention (not shown), container 38 (as shown in FIG. 3a) may consist of two or more compartments, each holding one component of material 40 which are mixed shortly before being deposited on substrate 222. This allows the use of materials which may have a limited pot life after mixing.

Figure 3B:
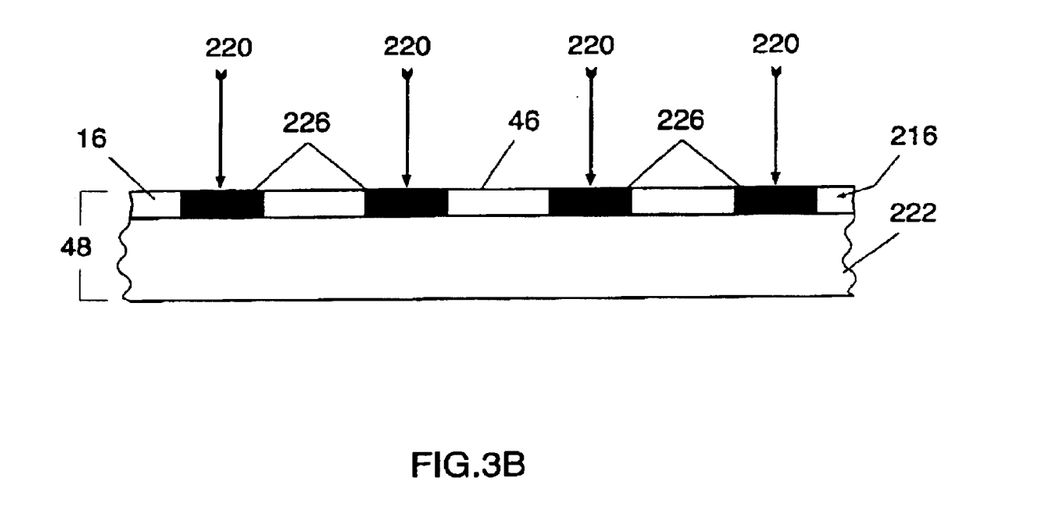

As shown in FIG. 3B, after substrate 222 is coated with material 40, it forms a photosensitive layer 216 which is not subject to any drying process as it contains little or no volatile material. In accordance with digital-imaging control signals pre-programmed by a user, layer 216 is exposed to a UV or visible light source 220, so as to produce polymerized areas 226 in layer 216, where exposed to the light source, and unpolymerized areas 46, where layer 216 remains unexposed.

Figure 3C:
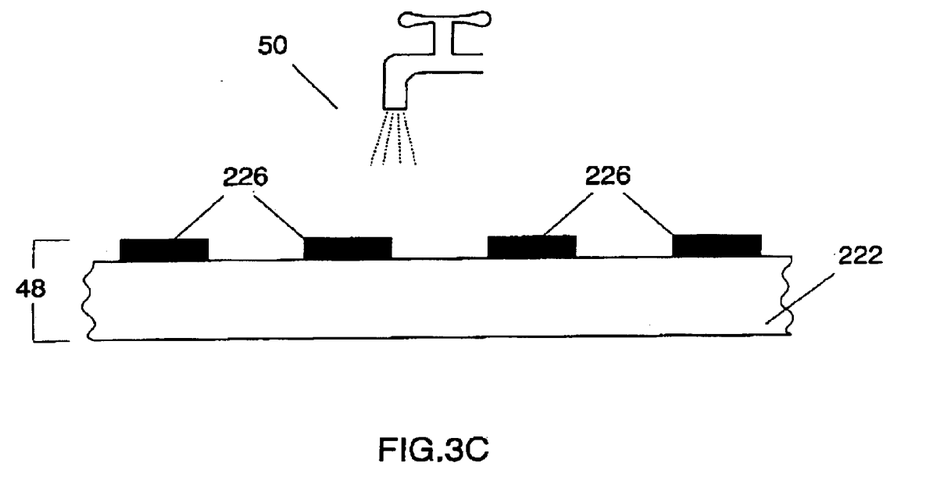

FIG. 3C shows exposed plate 48 being washed, preferably with tap water 50, or with a dilute aqueous solution to remove unpolymerized areas 46 (shown in FIG. 3B) of photosensitive material 40 and plate 48 is then ready for printing by a known offset lithographic process.

Figure 3D:
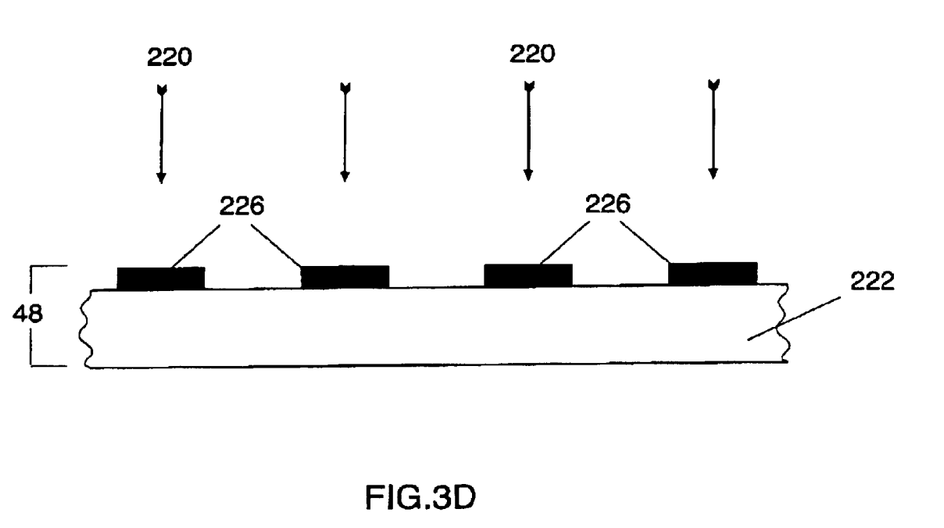

FIG. 3D shows a further step whereby plate 48, after washing, is flood-exposed with UV or visible light to further harden the polymerized areas 226 prior to printing by a known offset lithographic process.

Although all of the steps are depicted here as flat-bed, either the entire process can be arranged around a cylinder, or the coating can be flat-bed, as shown, and exposure to UV or visible light source can also be done either on a cylinder or a flat-bed.

The method of the present invention lends itself to application as a technique of CTP. The information to be printed may be provided as a digital signal in combination with a UV or visible light source, producing an image on an offset printing plate which may subsequently be printed.

Alternatively, in a further embodiment (not shown), the method can be adapted for imaging-on-press, the coating devices 38 and 42 (shown in FIG. 3A) replacing the automatic plate feed devices now available on offset printing machines, and the processing may be done by automatic plate cleaning devices (not shown), also currently available. In accordance with this preferred embodiment, the imaging device is attached to each plate cylinder.

Figure 4:
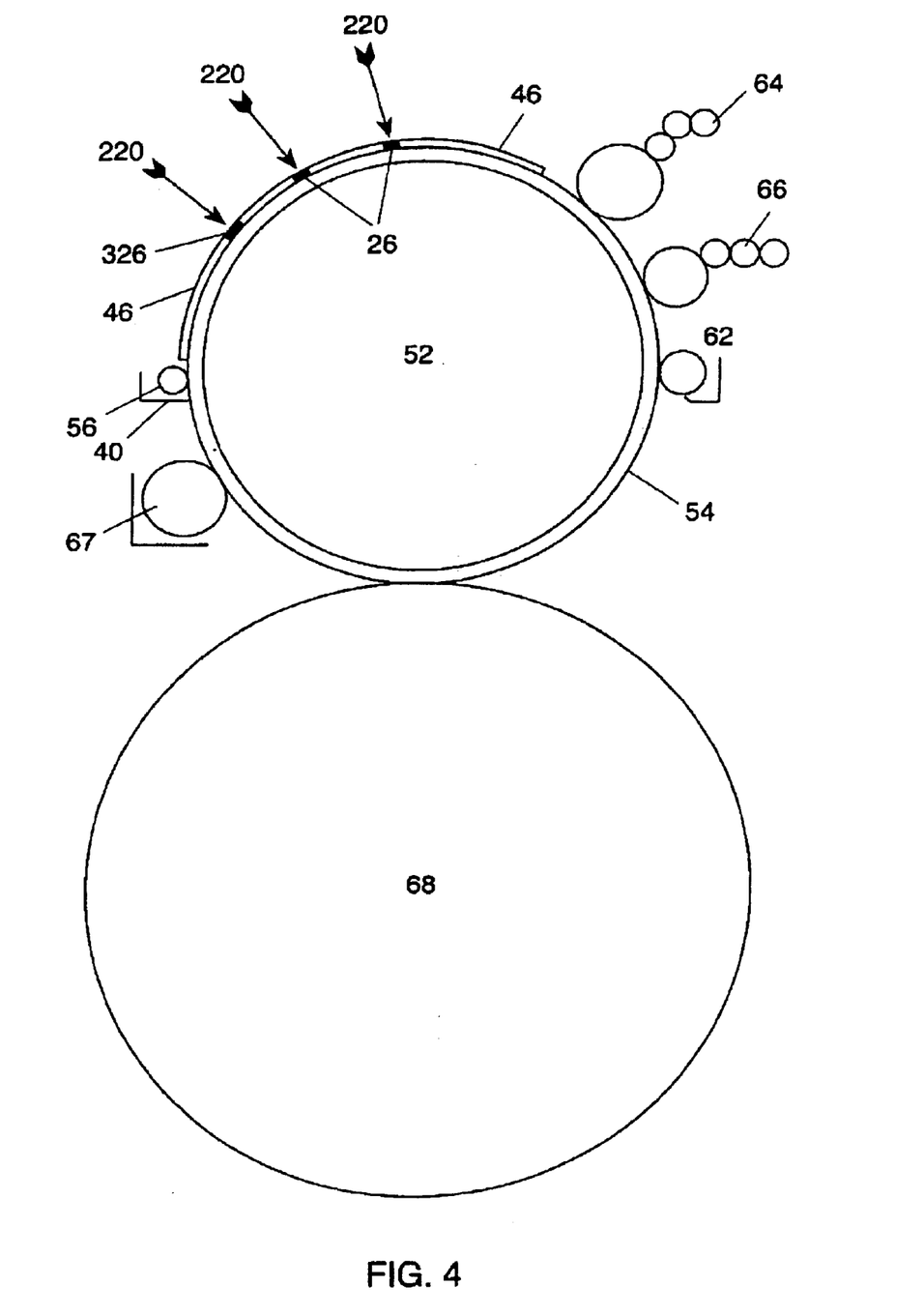
FIG. 4 shows another embodiment of the invention as used in a plateless, cylinder system.

FIG. 4 shows yet another embodiment of the present invention, whereby, photosensitive coating 40 is applied directly onto surface 54 of cylinder 52 itself instead of using a cylinder as in an offset machine which normally holds a plate. Thus, in the plateless process depicted here, surface 54 of cylinder 52 provides a reusable plate substrate which is cleaned after the completion of each printing job. Applicator 56 coats surface 54 of cylinder 52 with photosensitive material 40. The prepolymer coating formed is then digitally-imaged with UV or visible light source 220 which polymerizes the image areas 326. Any unpolymerized material 46 remaining on surface 54 of cylinder 52 is washed away by washing means 62 which contains an aqueous liquid.

The imaged and inked cylinder 52 is then printed by applying a fount from a conventional fountain system 64 and inking by means of an ink train 66. The ink is transferred from cylinder surface 54 to blanket cylinder 68 and thereafter printed in a known offset lithographic process. After the required number of copies have been produced, the entire layer of imaged material 326 is removed, either by abrasion or by means of a non-volatile solvent oil, thus erasing the image. An example of such an oil is ethyl lactate. The cycle can then be repeated by reapplying the photosensitive pre-polymer material 40.

Figure 5A:
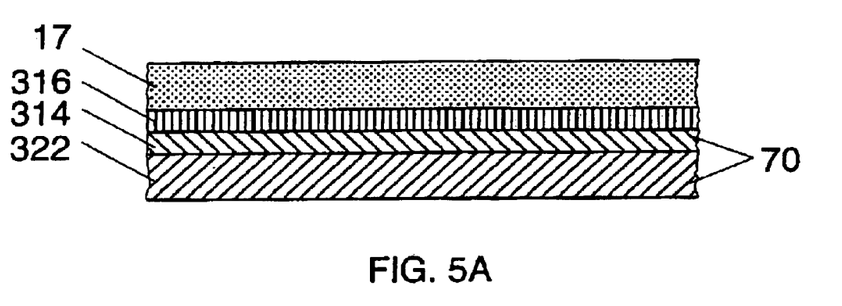
FIGS. 5A through 5C show enlarged sectional views of a further embodiment of the invention and a preferred method for the use thereof
Figure 5B:
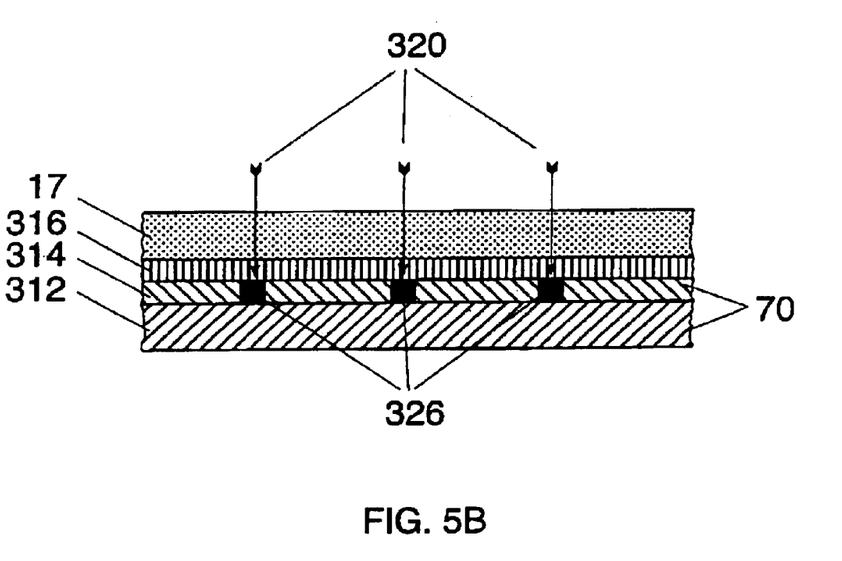
Figure 5C:
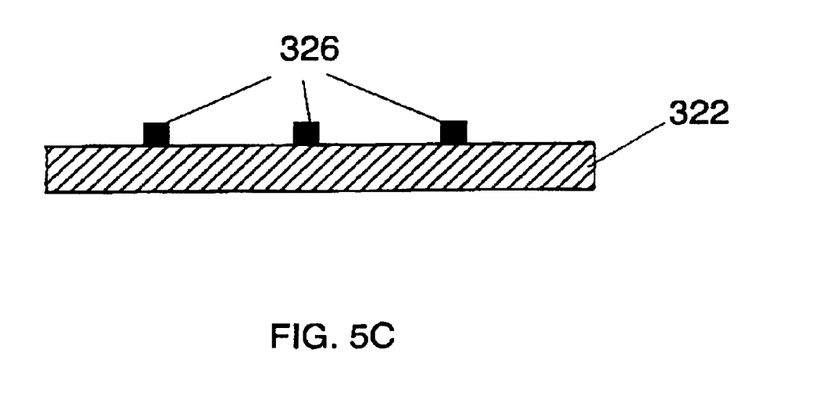

Another preferred embodiment of the present invention is depicted in FIGS. 5A through 5C. A manufactured plate 70 is supplied directly to the customer and comprises substrate 322, which, in a preferred embodiment, is comprised of grained, anodized aluminum, but generally characterized by a hydrophilic surface and a photosensitive coating 314, which also contains a small amount of non-light-sensitive binder. Such a coating would be sticky to the touch and therefore, film 17, comprising polypropylene, polyester or the like, with a release coating 316, such as silicone, is also provided. A sticky layer is applied to the hydrophilic anodized and grained aluminum substrate 322 in the manufacturing process, during which a release film is laminated onto the coating. This permits easy handling of the film during packaging and loading into the CTP system. The imaging can be done with or without the film in place. Generally, for UV imaging, any film between the masking image intermediate and the sensitive coating of the offset plate could reduce the image quality. But for CTP imaging without a masking film, this not the case. Moreover, if the release film remains, it provides an oxygen barrier and thus enhances the sensitivity of oxygen-inhibited photosensitive coatings.

During manufacture, film 17 with release coating 316 is laid upon the sticky surface of coating 314. Manufacturing is accomplished in on continuous process involving coating substrate 322 with a solution comprising a volatile solvent; evaporating the solvent; and then laminating film 17 with release coating 316 onto plate 70.

The customer receives a box of plates manufactured as described above and shown in FIG. 5A. These are for use in a CTP system in combination with a digitally-controlled UV or visible light source. Film 17 acts as a cover and provides a means of oxygen exclusion as well as giving optimum sensitivity and ease of development with aqueous solutions to the processing of plate 70.

As shown in FIG. 5B, photosensitive coating 314 is polymerized in imaged areas 326 after digital exposure to UV light 320. Film 17, together with its attached release coating 316, is then peeled away and the unexposed, unpolymerized material of photosensitive coating 314 is washed away with water or water containing minimal additives, leaving polymerized imaged areas 326 on substrate 322, as shown in FIG. 5C. Plate 70 is then ready for printing by a known offset lithographic process.

Although in the embodiment provided with a release film, a minimal amount of non-active binder is beneficial in providing some pre-polymerization bonding to substrate 322 to prevent distortion of layer uniformity caused by pressure from the release film, this is not the case in the embodiment where coating material 40 is supplied separately for application by the user. In this case, use of a non-active binder is not necessary. In both cases, the processing is done by washing in water or by use of a very dilute aqueous solution containing additives to aid washing. The inventor has found that even though the composition used may be insoluble and immiscible with water, nevertheless, they are removed by water washing.

However, it is preferable that part or all of the photopolymer precursors which may be oligomers or monomers are themselves water-soluble or miscible. In the embodiment providing a manufactured plate, whatever binder resin is present is water-soluble, while in the case of the embodiment where coating material 40 is applied by the user, water washability is achieved because material 40 is unpolymerized and in the form of a sticky liquid or semi-solid.

In defining the composition of the layer, there is a large range of suitable pre-polymer mixtures that may be used. The mixture may consist of oligomers, monomers and diluents together with photoinitiators and synergists and dye colorants.

Optionally, in the embodiment where the user is provided with an uncoated plate and some coating material, and preferably, in the embodiment providing a manufactured plate, as shown in FIG. 5, a small amount of binder should be added. This binder should be soluble in water or may be soluble in a dilute aqueous alkali such as provided by small quantities of sodium carbonate or sodium borate. Examples of suitable binders are hydroxypropyl cellulose, poly(2-ethyl-2-oxazoline), polymethylvinyl ether alt maleic acid, and styrene maleic anhydride copolymers and derivatives. The total amount of this polymer does not exceed 15% by weight of the solids content of the coating.

In the case of the embodiment where a finished, manufactured plate is sold to the customer, the coating may comprise volatile solvents or solvent mixtures such as methyl ethyl ketone, ethyl alcohol, toluene, ethyl acetate or butyl acetate. Such solvents are termed VOC's (volatile organic compounds) and are subject to strict control. They are more suitable for use and more manageable in a manufacturing plant where the solvent can be either recovered or incinerated. Where the coating is done in a customer environment, this is less appropriate and where a small amount of volatile solvent (less than 5% of total formulation) may be tolerated, it is most preferable to utilize solventless coatings characterized as 100% solids whereby, even though the coating material is a liquid under the conditions of coating, the entire coating is capable of polymerization without any material evaporating into the atmosphere.

There are a large variety of photopolymerizable oligomers and monomers as well as diluents that have been found to be advantageous for use in the present invention. It is preferable to have water-soluble oligomers, monomers and diluents present because this makes the washing off of the unpolymerized coating extremely easy. Examples of such oligomers are polyethylene glycol diacrylates, ethoxylated trimethylol propane acrylate and polyether acrylates.

Examples of monomers are 2 hydroxy-3-methylacryloxy propyltrimethylammonium chloride, hydroxyalkyl acrylate and dimethylaminoethyl acrylate. Examples of water-soluble diluents are N-methyl pyrrolidone, 2-amino ethanol, ethyl lactate and morpholine. Not all of the oligomer and monomer content needs to be water-soluble, and materials can also be chosen for their high reactivity and good adhesion to the aluminum base, once polymerized. Examples of oligomers and monomers found useful are tris(2-hydroxyethyl) isocyanurate triacrylate, carboxyl functional multifunctional methacrylate oligomers, and polyurethane acrylates.

In addition, such materials as amine synergists and surfactants to improve coating properties may also be present.

The following is an example of a formulation suitable for the preferred embodiment (all parts by weight):

| | |
|---|---|
| Tris (2-hydroxyethyl) isocyanurate triacrylate | 50 |
| 2-methyl-1-[4-(methylthio)phenyl]-2-morpholino propan-1-one | 4 |

| -continued | |
|---|---|
| 2-benzyl-2-N,N-dimethylamino-1-(4-morpholinophenyl)-1-butanone | 4.3 |
| Isopropylthioxanthone | 5.3 |
| CN 435 (polyether trifunctional acrylate, sold by Cray Valley Products of Exton, Pa, USA) | 30 |
| BYK 306 (silicone surface active agent sold by BYK-Cera, AM Deventer, Holland) | 1 |
| Rose Bengal | 1.8 |
| Triisopropanolamine | 1.9 |

The above-described formulation was mixed and then heated to 50° C. and maintained at that temperature until a clear solution was obtained. The mixture was coated onto a grained, anodized aluminum plate with a wire-wound rod to produce a minimal continuous layer. The layer was selectively exposed to a UV source of 300 nm to 400 nm to an extent of 200 micro-joules/cm². The unexposed material was washed away under running water drawn from a tap. The resulting image was inked up with offset lithographic ink and printed in an offset lithographic process known to the art.

Having described the present invention with regard to certain specific embodiments thereof, it is to be understood that the description is not meant as a limitation, since further modifications may now suggest themselves to those skilled in the art, and it is intended to cover such modifications as fall within the scope of the appended claims.

I claim:

1. A method of preparing an off set printing plate usable in an offset lithographic printing system said method comprising the steps of:
   a) providing an offset lithographic printing blank having a hydrophilic surface;
   b) providing a quantity of substantially non-volatile photosensitive liquid coating comprising: water-soluble photo-curable oligomer prepolymers, and photoinitiators, said liquid coating further comprising a maximum concentration of 15% of water soluble binder, as measured by solid wt.;
   c) applying a thin layer of said liquid coating to said hydrophilic surface of said printing blank;
   d) digitally imaging said coating, in a non-contact fashion, using a non-coherent ultra-violet light source to polymerize portions of said liquid coating in accordance with said imaging; and
   e) washing said liquid coating with an aqueous solution after said imaging to remove unpolymerized portions of said liquid coating, to obtain an offset lithographic printing plate.

2. The method of claim 1, wherein said liquid coating additionally comprises one or more of the group consisting of: water-soluble non-reactive diluents, amine synergists, surfactants and dyes.

3. The method of claim 2 wherein said water-soluble non-reactive diluents are selected from the group consisting of N-methyl pyrrolidone, 2-amino ethanol, ethyl lactate and morpholine.

4. The method of claim 1, wherein said oligomers are selected from the group consisting of polyethylene glycol diacrylates, ethoxylated trimethylol propane acrylate and polyether acrylates.

5. The method of claim 1 wherein said photosensitive liquid additionally comprises: water-insoluble monomers selected from the group consisting of tris(2-hydroxyethyl) isocyanurate triacrylate, hydroxyalkyl acrylate and dimethylaminoethyl acrylate.

6. The method of claim 1 wherein said binder is selected from the group consisting of: hydroxypropyl cellulose, poly(2-ethyl-2-oxazoline), polymethylvinyl ether alternating maleic acid, and styrene maleic anhydride copolymers.

7. The method of claim 1 where in step c, said liquid coating is applied onto said printing blank in a uniform manner using an applicator means.

8. The method of claim 7, wherein said applicator means comprises a container of said liquid coating which, by controlled movement of said container, applies said coating to the printing surface of said printing blank.

9. The method of claim 8, wherein said applicator means comprises the container of said liquid coating for depositing said coating onto printing blank, and a wirewound rod to uniformly spread said liquid coating over said printing blank.

10. The method of claim 8, wherein said container comprises a number of separate compartments for holding components of said liquid coating and a mixing means, thus allowing ready use in said coating of materials having a limited pot life after mixing.

11. The method of claim 1 wherein said aqueous solution is substantially water.

12. The method of claim 1 wherein said aqueous solution is exclusively water.

13. The method of claim 1 wherein said printing blank is comprised of grained, anodized aluminum.

14. The method of claim 1 wherein said digital imaging is performed by a CTP imaging system.

15. The method of claim 14 wherein in said CTP imaging system the non-coherent light source is controlled by a computer.

16. The method of claim 1 where said printing blank is the surface of an offset lithographic printing cylinder characterized as a plateless system whereby after printing, said surface is cleaned and re-coated for further imaging and printing cycles.

17. The method of claim 1, wherein after the washing step, the obtained printing plate is flood-exposed with at least one of UV and visible light to harden the polymerized portions.

18. The method of claim 1, wherein said liquid coating comprises not more than 5% by weight of solvent.

19. The method of claim 1 wherein said photosensitive liquid additionally comprises water-insoluble oligomers selected from the group consisting of: carboxyl multifunctional methacrylate oligomers, 2 hydroxy-3-methylacryloxy propyltrimethylammonium chloride and polyurethane acrylates.

* * * * *